March 24, 1970 E. SUSSMANN 3,502,517
METHOD OF INDIFFUSING DOPING MATERIAL FROM A GASEOUS PHASE, INTO A SEMICONDUCTOR CRYSTAL
Filed Dec. 5, 1966
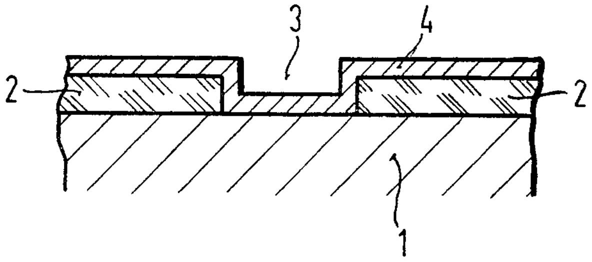

United States Patent Office 3,502,517

Patented Mar. 24, 1970

3,502,517

METHOD OF INDIFFUSING DOPING MATERIAL FROM A GASEOUS PHASE, INTO A SEMICONDUCTOR CRYSTAL

Erhard Sussmann, Poing, Germany, assignor to Siemens Aktiengesellschaft, Berlin and Munich, Germany Filed Dec. 5, 1966, Ser. No. 598,986
Claims priority, application Germany, Dec. 13, 1965, S 100,933
Int. Cl. H01l 7/44, 7/36
U.S. Cl. 148—175 3 Claims

ABSTRACT OF THE DISCLOSURE

A new method of indiffusing doping material into a semiconductor body is shown. This method consists of preparing and $SiO_2$ layer on the semiconductor body, cutting a window therein, depositing a doped semiconductor layer thereon and indiffusing the dopant from the doped semiconductor layer.

DESCRIPTION OF THE INVENTION

In planar and other techniques for the production of semiconductor devices such as transistors, doping material is indiffused from a gaseous phase into the semiconductor base crystal. A silicon dioxide, $SiO_2$ mask grown on the surface of a semiconductor base crystal and having at least one diffusion window is used. A silicon semiconductor crystal is preferred, so that the $SiO_2$ mask may be produced directly through oxidation of the crystal surface, followed by etching out the diffusion windows. This is preferably achieved by the known method of photo-lithography. The doping material used may either be elemental or a compound, especially a halide or oxide.

The effectiveness of the $SiO_2$-layer, coating the semiconductor, as a mask is probably based upon the fact that the diffusion material which is used for the diffusion process has in the $SiO_2$ layer a diffusion coefficient which is lower by several orders of magnitude, than in the semiconductor material, even at the high temperatures required for diffusion. For a number of doping materials, for example Ga, In, P, Sb and As, an even smaller diffusion speed in $SiO_2$ would be desirable, than is presently available. Whenever these doping materials are to be indiffused by using the known $SiO_2$ masking technique, relatively thick and therefore expensive $SiO_2$ layers are to be used for masking. The production of these thick masking layers leads to an undersirable change in the previously established doping profiles of semiconductor bodies. This change results from the long intervals and/or high temperatures necessary in the method.

The present invention has an object overcoming these difficulties and relates to a method for diffusing doping material from the gaseous phase into a semiconductor base crystal, especially of silicon. A mask, preferably comprised of $SiO_2$, having at least one diffusion window extending to the actual surface of the semiconductor base crystal is used. According to the invention, a semiconductor layer, preferably comprised of the same material as the base crystal, and containing the doping material to be indiffused, is precipitated from the gaseous phase at least upon the entire surface of the semiconductor base crystal, which is exposed through the diffusion window. The doping material from this semiconductor layer is thereafter diffused into the base crystal. The semi-conductor layer precipitated from the gaseous phase may now be at least partially removed.

The advantage of my method lies in the fact that the semiconductor layer precipitated from the gaseous phase, need not be limited to the semiconductor surface exposed by the diffusion window. The highly doped semiconductor layer, which was precipitated from a gaseous phase, may also coat the $SiO_2$ masking. By introducing the doping material derived from a gaseous phase into a solid semiconductor layer, before indiffusion into the semiconductor base crystal, it is more difficult for the doping material to penetrate into the $SiO_2$ layer of the masking than if the doping material were to penetrate the $SiO_2$ of the actual mask directly from the gaseous phase, or from a glass layer, containing the doping material. The use of the latter is necessary when $B_2O_3$ or $P_2O_5$ is the doping material. Thus, the present invention results in an increase of the "masking capacity" of the $SiO_2$ mask by at least the factor 10. The only exception to this is where boron is the doping material for which the ratio is less favorable.

The figure shows a preferred embodiment.

As mentioned supra, the layer precipitated from the gaseous phase is of the same semiconductor material as the base crystal. In the situation illustrated in the figure: A silicon dioxide $SiO_2$ layer 2 was grown as a mask upon the surface of the semiconductor base crystal 1, which is of silicon Si. The $SiO_2$ layer 2 was grown, for example, through thermic oxidation. A window 3 extending to the surface of the base crystal 1 was etched into the silicon dioxide layer. Thereafter a highly doped silicon layer 4 is deposited upon the semiconductor surface exposed by the window 3 and at least the adjacent mask 2. This silicon layer 4 in the window borders the silicon of the base crystal. Under these conditions, the doping material of the epitactic layer 4, easily traverses this boundary. On the other hand, as already established, a particularly large "resistance" is offered the doping material where it encounters the border of the epitactic silicon layer 4 and the silicon dioxide mask 2. This applies especially to silicon and germanium and explains the main advantage of the method, namely that those portions of the semiconductor base crystal, which are to be protected by the $SiO_2$ mask, are better protected against the doping material to be indiffused.

The invention may be executed without changing the apparatus. This is achieved by effecting the epitactic precipitation of the layer 4, the indiffusion of the doping material from said layer into the semiconductor base crystal and the etching of the layer 4 in the same vessel, by means of appropriate reaction gases. Thus, to precipitate an Si layer 4, the reaction gas of $SiHCl_3$ containing doping material and mixed with hydrogen may be used. To effect the diffusion process, one can operate with neutral gas of hydrogen, while to etch the silicon layer 3, hydrogen, mixed with HCl may be used. The individual reaction conditions are well known. The removal process may be followed especially above the $SiO_2$ mask, by optical means for example, through infra-red reflections.

The spatial course of the doping concentration profile after diffusion is $$C(x,t) = C_1 + \frac{C_0 - C_1}{2}\, erf\left(\frac{a-x}{2\sqrt{Dt}}\right) + erf\left(\frac{a+x}{2\sqrt{Dt}}\right)$$

$C_0$=doping concentration in the grown layer 4
$C_1$=doping concentration in the base crystal 1
$x$=removal of surface in window 3
$a$=thickness of the grown layer 4 in window 3
D=diffusion coefficient of the doping material
$t$=time Through an appropriate choice of magnitudes $a$, $C_0$ and $t$ different profiles may be obtained. If necessary, the highly doped layer 4 may remain in order to afford a contacting possibility to the semiconductor material located underneath.

I claim:

1. A method of producing a silicon planar semiconductor device which comprises depositing a mask on an original silicon crystal, cutting a window in said mask, depositing an epitactic layer of semiconductor material, containing the dopant to be indiffused, from the vapor phase upon the mask so that at least the window is completely covered, thereafter indiffusing the dopant into the semiconductor body and thereafter removing the epitactic silicon layer.

2. The method of claim 1, wherein the mask is silicon dioxide and the deposited semiconductor layer is silicon.

3. The method of claim 2, wherein the dopant material is selected from gallium, indium, arsenic, antimony and phosphorus.

References Cited

UNITED STATES PATENTS

| | | | |
|---|---|---|---|
| 3,089,794 | 5/1963 | Marinace | 148—175 |
| 3,149,395 | 9/1964 | Bray | 148—175 |
| 3,189,973 | 6/1965 | Edwards | 148—174 |
| 3,275,910 | 9/1966 | Phillips | 148—187 |
| 3,309,245 | 3/1967 | Haenichen | 148—187 |
| 3,326,729 | 6/1967 | Sigler | 148—187 |
| 3,341,381 | 9/1967 | Bergman | 148—187 |

L. DEWAYNE RUTLEDGE, Primary Examiner
R. A. LESTER, Assistant Examiner

U.S. Cl. X.R.

148—187, 188